United States Patent
Eevers et al.

(10) Patent No.: US 7,608,328 B2
(45) Date of Patent: Oct. 27, 2009

(54) WATER-PERMEABLE ADHESIVE TAPE

(75) Inventors: Walter Eevers, Genk (BE); Ann Issaris, Genk (BE); Yoshiaki Mitsuoka, Genk (BE); Edwin Thys, Genk (BE); Yuuzou Akada, Osaka (JP)

(73) Assignees: Nitto Denko Corporation, Osaka (JP); Nitto Europe N.V., Genk (BE)

( * ) Notice: Subject to any disclaimer, the term of this patent is extended or adjusted under 35 U.S.C. 154(b) by 128 days.

(21) Appl. No.: 11/650,450

(22) Filed: Jan. 8, 2007

(65) Prior Publication Data

US 2007/0110955 A1   May 17, 2007

Related U.S. Application Data

(63) Continuation of application No. 09/818,936, filed on Mar. 28, 2001.

(30) Foreign Application Priority Data

Mar. 30, 2000   (EP) .................................. 00106824

(51) Int. Cl.
*B32B 15/04* (2006.01)
(52) U.S. Cl. .................. 428/349; 428/308.4; 428/317.5
(58) Field of Classification Search ......... 442/142–151, 442/286, 327, 394, 399; 428/43, 131, 308.4, 428/317.5, 343, 346, 349, 356, 355 R, 355 CN
See application file for complete search history.

(56) References Cited

U.S. PATENT DOCUMENTS

| 4,702,788 A | 10/1987 | Okui |
| 5,229,185 A | 7/1993 | Shiota et al. |
| 6,114,753 A | 9/2000 | Nagai et al. |

FOREIGN PATENT DOCUMENTS

| EP | 0 157 508 A2 | 10/1985 |
| JP | 63 136527 A | 6/1988 |
| JP | 2-112258 A | 4/1990 |
| JP | 6-21220 A | 1/1994 |
| JP | 9-272850 A | 10/1997 |
| JP | 09-321084 A | 12/1997 |
| JP | 10-072573 A | 3/1998 |
| JP | 11-151661 A | 6/1999 |
| WO | WO 95/32834 A | 12/1995 |

OTHER PUBLICATIONS

European Search Report dated Sep. 29, 2000.

*Primary Examiner*—Arti Singh-Pandey
(74) *Attorney, Agent, or Firm*—Sughrue Mion, PLLC

(57) ABSTRACT

The present invention relates to a water-permeable adhesive tape for processing semiconductor wafers and/or semiconductor related materials comprising at least one base film and an adhesive, wherein said at least one base film possesses perforations and has a cavity ratio of 3.0 to 90%. The water-permeable adhesive tape is in particular suitable for dicing semiconductor wafers and/or semiconductor related materials using laser technology.

19 Claims, 1 Drawing Sheet

Fig. 3  0.4 mm(diameter)
1.0mm

In a staggered arrangement pitch
(Example 5)

1.0mm
0.2mm

In a regular pattern pitch
(Example 3)

0.5mm(diameter)
1.0mm

In a staggered arrangement pitch
(Example 4)

WATER-PERMEABLE ADHESIVE TAPE

This is a continuation of application Ser. No. 09/818,936 filed Mar. 28, 2001. The entire disclosure of the prior application, application Ser. No. 09/818,936, is hereby incorporated by reference.

BACKGROUND OF THE INVENTION

The present invention relates to a water-permeable adhesive tape for processing semiconductor wafers and/or semiconductor related materials. More particularly, the present invention is concerned with a water-permeable adhesive tape which can be used to fix a semiconductor wafer when cutting and separating the semiconductor wafer into IC element chips.

Conventionally, semiconductor wafers and semiconductor related materials are separated into chips and IC parts by cutting the wafers or the material with a rotary diamond blade which is also known as a dicing blade. Semiconductor related materials as described in the present invention include a BGA package, printed circuits, ceramic boards and glass parts for liquid crystal equipment. In the aforementioned method, the semiconductor wafers and semiconductor related materials are cut into IC element chips by means of diamond particles in the blade. In order to fix the semiconductor wafer or semiconductor related material during this dicing process, the semiconductor wafer or semiconductor related material is usually bonded to an adhesive tape which is also known as a dicing tape. After the semiconductor wafer or semiconductor related material has been cut into IC element chips, the IC element chips can be picked up from the adhesive tape. The adhesive tape used for such a process possesses generally a layer made up of a synthetic resin, e.g. PVC, which is adhered to the wafer by means of an adhesive layer.

Recently, one drawback of this method has evolved in that cracking, chipping or defects of the IC chips and parts which are cut by this method have become a major problem resulting in poor quality of the chips and parts and a reduced productivity of this cutting method. This problem has developed as a result of down-sizing electronic equipment and the growing demand to provide wafers having a more and more reduced thickness. However, as the thickness of the semiconductor materials decreases, the tendency of this material to crack upon dicing increases. Also, some hardly separated and, thus, more brittle and harder semiconductor related materials have appeared which are more susceptible to chipping. The principle cause of this cracking or chipping problem is the cutting mechanism of the rotary diamond blade.

In order to overcome this problem, other cutting techniques have become the focus of attention and in particular laser technology appears to be advantageous since dicing using a laser beam is much more accurate and this accuracy is not greatly influenced by the thickness of the material which is to be cut. Specifically, a laser technology which may be useful for the above purpose has been described in WO 95/32834 and discloses the use of a laser beam to process material by cutting, drilling, welding, marking and material stripping whereby the laser beam is guided by a liquid jet. Specifically, a laser beam which is guided by a water stream is used to process various materials. However, one problem which may occur during the separation process using this laser technology is that chips and IC parts can delaminate from an adhesive tape bonded thereto. Due to the high pressure applied to the adhesive surface by, e.g. the water stream, these chips and IC parts cannot be fixed perfectly on the adhesive tape. Conventional adhesive tapes for processing semiconductor wafers and semiconductor related materials are therefore not suitable for laser dicing technology since chips and IC parts may fly off from the wafer or material during the dicing step or may be destructed by contamination with molten particles from the dicing.

SUMMARY OF THE INVENTION

Therefore, it is an object of the present invention to provide an adhesive tape for processing semiconductor wafers and/or semiconductor related materials, in particular for dicing said wafers or materials, which tape enables the processing of very thin semiconductor wafers or materials without leading to any processing problems, such as chipping or other defects of the chips or IC parts, and which tape simultaneously ensures good adherence of the wafer or material thereon and prevents delamination of the chips or parts therefrom during the dicing step.

This object has been achieved by a water-permeable adhesive tape for processing semiconductor wafers and/or semiconductor related materials, comprising at least one base film and an adhesive, wherein said at least one base film possesses holes with a cavity ratio of 3.0 to 90%.

It was surprisingly found that the aforementioned water-permeable adhesive tape can efficiently avoid the aforementioned problems and is generally suitable for processing semiconductor wafers and/or semiconductor related materials, in particular for dicing said wafers or materials. Therefore, such a water-permeable adhesive tape can be used for processing semiconductor wafers and/or semiconductor related materials by laser technology, in particular, by a laser microjet process.

BRIEF DESCRIPTION OF THE DRAWINGS

FIG. 3 is a schematic representation showing a staggered arrangement pitch of the perforations in the base film of the adhesive tape in accordance with Example 5 of the present invention.

DESCRIPTION OF THE PREFERRED EMBODIMENTS

Figure 1:
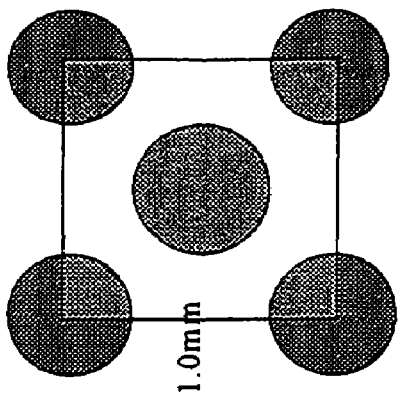
FIG. 1 is a schematic representation showing a regular pattern pitch of the perforations in the base film of the adhesive tape in accordance with Example 3 of the present invention.
Figure 1:
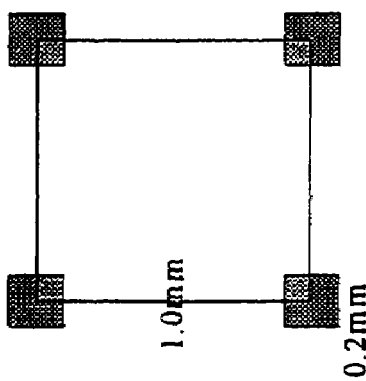

The water-permeable adhesive tape in accordance with the present invention comprises at least one base film. Examples of the material suitable for the base film include synthetic resins such as films of polyolefins, e.g. polyethylene and polypropylene, polyethylene terephthalate, polyurethane, EVA, polytetrafluoroethylene, polyvinylchloride, polyvinylidene chloride, polyamide, acetal resin, polystyrene and polycarbonate, but also non-woven fabrics comprising polymeric fibers such as PP, PVC, PE, PU, PS, PO or PET, synthetic fibers such as rayon or cellulose acetate, natural fibers such as cotton, silk or wool and inorganic fibers such as glass fibers or carbon fibers and also woven fabrics comprising polymeric fibers such as PP, PVC, PU, PS, PE, PO or PET, synthetic fibers such as rayon or cellulose acetate, natural fibers such as cotton, silk or wool.

The base film possesses holes or perforations, respectively, which are throughholes in the thickness direction of the base film. The perforations may be regularly or irregularly provided on the base film. If the material of the base film comprises fibers, the perforations may be obtained naturally as a result of the fiber-fiber interstices, thus, rendering the base film porous. On the other hand, if the base film comprises polymeric resins, the perforations may be artificially introduced. The aforementioned porous non-woven material comprising fibers may further comprise artificial perforations in addition to the natural pores or holes. Such an arrangement is of advantage in order to increase the water-permeability of the water-permeable adhesive tape of the present invention.

The base film can be perforated by conventional methods of making throughholes. Examples of such methods include mechanical, chemical and/or thermal methods generally known in the art. As mechanical methods of perforating the base film, punching by using a press machine or a rotary roll, laser treatment and water jet treatment may be mentioned. Moreover, inorganic particles can be formulated into the base film upon production of the base film. When the film is expanded, some of the particles are broken resulting in holes in the film. As chemical methods of perforation, the following may be mentioned. A blowing agent can be formulated into the base film material and upon production of the base film, blowing occurs resulting in the desired holes. In another chemical method, a base polymer and a compound which is easily soluble in a solvent are used to prepare the base film. After the film sheeting the base film is then dipped into said solvent followed by drying and expansion, resulting again in perforations.

The water-permeable adhesive tape of the present invention has sufficient perforations in order to ensure good water-permeability and to prevent delamination of the water-permeable adhesive tape during the dicing process. The shape of the perforations is not limited as long as it ensures water-permeability. For example, the hole shape may be irregular as in the case of the fiber-fiber interstices of fiber-containing base materials. The perforations may also be circular, square, triangular, rhombic or star-like in shape. The size of the perforations (hole size) as measured by microscope is usually <3.2 mm$^2$, preferably 0.001 to 3.2 mm$^2$, more preferably 0.1 to 2.0 mm$^2$, most preferably 0.2 to 1.1 mm$^2$. If the holes are circular in shape, the hole size may be expressed with respect to the diameter which is preferably 0.17 to 0.80 mm, more preferably 0.25 to 0.59 mm. If the perforations are square, triangular or rhombic in shape, the hole size may be given as the length of one side of the square, triangle or rhombus and is preferably 0.30 to 1.40 mm, more preferably 0.45 to 1.00 mm. The hole density is preferably more than 100,000 holes/m$^2$, more preferably 300,000 to 700,000 holes/m$^2$. The hole density is calculated from the pitch distance in length direction and transverse direction.

The water-permeable adhesive tape of the present invention has a cavity ratio of 3 to 90%. If the cavity ratio is less than 3%, the water-permeability is poor and delamination of the chip from the adhesive tape and/or contamination emerging between the tape and the chip can occur. On the other hand, a cavity ratio of more than 90% can result in a poor mechanical strength of the tape, smoothness deterioration of the tape and poor anchoring between the base film and the adhesive. The cavity ratio describes the proportion of cavities or perforations in the base film. When the base film contains artificial perforations, the cavity ratio is preferably 3 to 60%, more preferably, 10 to 55%, most preferably 20 to 50%. In this case, the cavity ratio is decided from the hole size and the hole density, i.e.

cavity ratio=(hole size)×(hole density)×100%.

If a porous non-woven material comprising fibers is employed as the base material, the cavity ratio is preferably 10 to 80%, more preferably 20 to 70%. In this case, the cavity ratio is decided from the weight of the non-woven material per unit area, the material density and the thickness of the non-woven material so that cavity ratio=(weight of non-woven material per unit area)/(material density)/(thickness of non-woven material)×100%.

The thickness of the non-woven material is measured by thickness gauge.

If necessary, the base film may be subjected to surface treatment for the enhancement of the adhesiveness to the adhesive film, such as corona discharge treatment, flame treatment, plasma treatment, sputter etching treatment or undercoating (e.g., primer) fluor treatment, on the surface thereof on which the adhesive film is formed.

The thickness of the base film is generally 10 to 400 μm, preferably 30 to 250 μm. If the thickness is less than 10 μm, the tape may be easily broken or may be cut during the processing of the semiconductor wafers and/or semiconductor related materials.

If the thickness is more than 400 μm, the preparation of the water-permeable adhesive tape of the present invention becomes rather expensive.

It is possible to use one of the aforementioned base films singly or two or more of said base films as a multilayered structure. Such a multilayer film can be prepared by conventional methods.

The water-permeable adhesive tape of the present invention further contains an adhesive which is typically applied on one surface of the base film. The adhesive can be prepared by using a general adhesive composition, preferably a rubber- or acrylic-based adhesive.

The rubber- or acrylic-based adhesive may comprise as a base polymer rubbers such as natural rubber and various synthetic rubbers or acrylic-based polymers such as a acrylonitrile polyalkyl acrylates or methacrylates having linear or branched alkyl groups with less than 30 carbon atoms, preferably 1 to 18 carbon atoms such as methyl, ethyl, propyl, isopropyl, n-butyl, t-butyl, isobutyl, amyl, isoamyl, hexyl, cyclohexyl, 2-ethylhexyl, octyl, isooctyl, nonyl, isononyl, decyl, isodecyl, lauryl, tridecyl, tetradecyl or stearyl groups. It is possible to use a mixture of the above groups. Other adhesives, e.g. polybutene- or polybutadiene-based adhesives, are also possible. The above adhesive is generally present in an amount of 50 to 100 wt. %.

If necessary, a multifunctional monomer can be added into the adhesive as a crosslinking agent. Examples of the crosslinking agent include hexan-diol-di-(meth)acrylate, (poly)ethylene glycol-di(meth)acrylate, (poly)propylene glycol-di(meth)acrylate, tri(meth)acrylate and urethane acrylate. The crosslinking agent can be used alone or as a mixture of more than two compounds. The amount of the crosslinking agent is preferably less than 30 wt. % based on the total monomer weight in order to control the total adhesive properties.

The adhesive may be pressure-sensitive, light-sensitive or heat-sensitive (thermally sensitive) or a combination of these. In the case of a light-sensitive adhesive, the adhesive can be cured by light irradiation, in particular, UV-light irradiation. Upon irradiation with light, the adhesion strength can be reduced due to the formation of a three-dimensional network structure within the adhesive. In the case of a heat-sensitive adhesive, the adhesion strength is reduced when the adhesive is subjected to heating.

If a light-sensitive adhesive is used, a monomer or oligomer which can react by light irradiation, a so-called photopolymerizable compound, can be incorporated into the adhesive. Examples of such a monomer include urethane, methacrylate, trimethyl propane trimethacrylate, tetramethylol methane tetramethacrylate and 4-butylene glycol dimethacrylate. The amount of the photopolymerizable compound is generally in the range of from 5 to 500 parts by weight, preferably 70 to 150 parts per 100 parts by weight of the base polymer. Moreover, in this case, a photopolymerization initiator is also included. Examples of the initiator include acetophenone compounds such as 4-(4-hydroxyethoxy)phenyl(2-hydroxy-2-propyl)ketone, methoxy acetophenone and 1-hydroxycyclohexyl phenyl ketone, benzoine ether compounds such as benzoine ethyl ether and benzoine isopropyl ether, ketal compounds, aromatic sulfonyl chloride compounds, light-active oxime compounds and benzophenone compounds. Again, these compounds can be used alone or as mixtures thereof. More details regarding a light-sensitive adhesive are, e.g. provided in EP-A-157 508.

If the adhesive is a heat-sensitive adhesive, the adhesive can contain a so-called heat blowing component. The blowing occurs as a result of heating the tape. The bonding surface between the adhesive tape and the semiconductor wafer or semiconductor related material is decreased due to a process referred to as pebbling resulting from the blowing. Thus, the adhesion strength is reduced. Examples of the blowing agent include a blowing agent from the decomposing type and the microcapsule type. Further information concerning a heat-sensitive adhesive are, e.g. provided in EP-A-0 523 505.

If necessary, the adhesive properties of the adhesive can be controlled by, for example, blending any appropriate tackifier such as terpene resins (e.g., α-pinene polymer, β-pinene polymer, diterpene polymer, α-pinene-phenol copolymer), hydrocarbon resins (e.g., aliphatic resin, aromatic resin, aliphatic-aromatic copolymer), rosins, cumarone-indene resins, (alkyl) phenol resins, xylene resins or alkyd resins in the adhesive.

The adhesive properties of the adhesive can further be controlled by blending any appropriate softening agent such as a low molecular weight polyisobutylene as a blending component corresponding to a polyisobutylene and a paraffin-based oil as a blending component corresponding to an A-B-A type block polymer, if necessary.

The adhesive may further comprise any appropriate additive such as fillers, pigments, anti-aging agents or stabilizers, incorporated therein, if necessary.

The adhesive may also contain perforations in order to further enhance the water-permeability. The perforations can be provided by any of the methods described above for the base film. The perforations may be provided simultaneously with the perforations of the base film or in a separate process. It is, however, not necessary that the adhesive possesses perforations since the adhesive can be cut completely during the processing by the laser beam or the water jet so that the water-permeability of the adhesive will be of no importance.

The adhesive has generally a thickness of less than 300 μm, preferably from 3 to 200 μm, more preferably 3 to 100 μm, even more preferably 5 to 100 μm, most preferably 5 to 70 μm. If the thickness is less than 3 μm, sufficient adhesion strength may not be obtained. On the other hand, if the thickness is greater than 300 μm, it is possible that an undesirable adhesive residue can be formed on the backside of the semiconductor wafer or semiconductor related material after removing the tape from the wafer or material and the water beam may not be able to cut the adhesive layer in order to let the water go through.

The 100% modulus (20° C.) of the adhesive is generally 10 kg/cm$^2$ or less, and preferably from 0.5 to 8 kg/cm$^2$. The gel content therein as determined by immersing in toluene (20° C.) for 24 hours is usually less than 55% by weight, preferably from 0.5 to less than 55% by weight, and more preferably from 35 to less than 55% by weight, and the degree of gel swelling is generally at least 20 times and preferably from 25 to 80 times.

The water-permeable adhesive tape of the present invention can be prepared by any conventional tape manufacturing method known in the art. In general, the base film possessing perforations and having a cavity ratio of 3.0 to 90% is provided first. It is, however, also possible to provide the perforations after the step of coating the base film with the adhesive. The adhesive can be coated directly onto the base film material. Alternatively, the adhesive coating can be performed by a transfer coating process whereby the adhesive is firstly coated onto a release coated process material. After a possible carrier solvent has been removed by drying, the adhesive is then laminated onto the base film. The coating process can be performed by any existing coating method. For example, reverse roll coating, gravure coating, curtain spray coating, die coating, extrusion and other industrially applied coating methods may be used. Furthermore, adhesive calendaring can also be employed in order to coat the adhesive onto the base film.

Preferably, it is possible to elongate the water-permeable adhesive tape of the present invention although elongation is not always required in the processing of semiconductor wafers and/or semiconductor related materials. Preferably, the elongation value is more than 10%, more preferably 20% of the original tape length. The elongation of the tape may be useful for the process of picking up the chips from the adhesive tape after the dicing process.

The tensile strength of the water-permeable adhesive tape of the present invention is generally more than 0.1 N/20 mm, preferably more than 0.3 N/20 mm. If the tensile strength is too small, the water-permeable adhesive tape of the present invention may be easily broken and/or cut when processing semiconductor wafers and/or semiconductor related materials.

The tensile strength and the elongation are measured by using a dynamometer using samples being 5.0 cm long and 20 mm wide. The speed at which the tests are performed is 300 mm/min at room temperature and 50% relative humidity. The elongation percentage is calculated as follows:

elongation=(length at time of breaking−original length)/(original length)×100%.

The force measurement at this point is described as the tensile strength of the tape. Thus, the test methods for the tensile strength and the elongation are based on ASTM D1000.

The water-permeable adhesive tape of the present invention has generally an adhesive strength of less than 20 N/20 mm, preferably 0.15 to 10 N/20 mm on an Si-wafer under the conditions of room temperature and 50% relative humidity, 180° peeling adhesion and a peeling speed of 300 mm/min (according to ASTM D1000). If the adhesive is light-sensitive, i.e. it can be cured by light irradiation, or if it is heat-sensitive, i.e. it can be released by heat, the adhesion strength is generally less than 20 N/20 mm, preferably 0.15 to 10 N/20 mm before the light or heat treatment and typically less than 2 N/20 mm after said treatment.

The present invention is described in more detail with reference to the following examples. All parts are parts by weight.

EXAMPLE 1

An acrylic adhesive comprising 100 parts of an acrylic copolymer, 30 parts of a plasticizer and 10 parts of a crosslinking agent was coated on one surface of a 50 μm thick process liner in a thickness of 15 μm and was then dried for 3 minutes at 100° C. Immediately after drying, a 200 μm thick non-woven sheet composed of polypropylene fibers having holes, the sheet being further perforated with a cavity ratio of 30% of perforations of 0.1 to 0.3 mm in size, was laminated onto this coating to obtain a thin adhesive tape for processing semiconductor wafers. This tape showed a tensile strength of 22 N/20 mm and an elongation of 55% in machine direction (length direction) and a tensile strength of 16 N/20 mm and an elongation of 70% in cross direction (transverse direction).

EXAMPLE 2

An acrylic adhesive comprising 100 parts of an acrylic copolymer, 30 parts of a plasticizer and 10 parts of a crosslinking agent was coated on one surface of a 50 μm thick process liner in a thickness of 15 μm and was then dried for 3 minutes at 100° C. Immediately after drying, a 200 μm thick non-woven sheet composed of polypropylene fibers and having holes, the sheet being further perforated with cavity ratio of 50% of perforations of 0.1 to 0.3 mm in size, was laminated onto this coating to obtain a thin adhesive tape for processing semiconductor wafers. This tape showed a tensile strength of 18 N/20 mm and an elongation of 110% in machine direction and a tensile strength of 15 N/20 mm and an elongation of 125% in cross direction.

EXAMPLE 3

An acrylic adhesive comprising 100 parts of an acrylic copolymer, 30 parts of a plasticizer and 10 parts of a crosslinking agent was coated on one surface of an EVA (9% vinyl content)/polyethylene=30/70 wt. % film in a thickness of 15 μm and was then dried for 3 minutes at 100° C. Immediately after coating, the prepared adhesive tape was perforated with square holes of 0.04 mm² in area in a regular pattern pitch distance of 1 mm in both machine and cross directions to obtain an adhesive tape for processing semiconductor wafers (see FIG. 1). This tape showed a tensile strength of 20 N/20 mm and an elongation of 60% in machine direction and a tensile strength of 17 N/20 mm and an elongation of 70% in cross direction.

EXAMPLE 4

Figure 2:
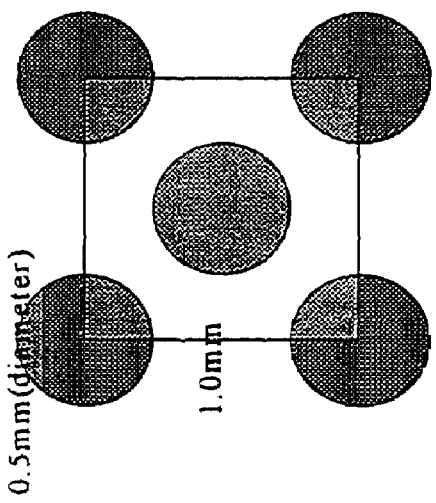
FIG. 2 is a schematic representation showing a staggered arrangement pitch of the perforations in the base film of the adhesive tape in accordance with Example 4 of the present invention.

An acrylic adhesive comprising 100 parts of an acrylic copolymer, 30 parts of a plasticizer and 10 parts of a crosslinking agent was coated on one surface of an EVA (9% vinyl content)/polyethylene=30/70 wt. % film in a thickness of 15 μm and was then dried for 3 minutes at 100° C. Immediately after coating, the prepared adhesive tape was perforated with circular holes of 0.2 mm² in area in a staggered arrangement pitch distance of 1 mm between each hole to obtain an adhesive tape for processing semiconductor wafers (see FIG. 2). This tape showed a tensile strength of 15 N/20 mm and an elongation of 50% in machine direction and a tensile strength of 12 N/20 mm and an elongation of 60% in cross direction.

EXAMPLE 5

An acrylic copolymer, a urethane oligomer as a photopolymerizable compound and a photopolymerization initiator were coated on one surface of an EVA (9% vinyl content)/polyethylene=30/70 wt. % film in a thickness of 10 μm and was then dried for 3 minutes at 100° C. (see EP-A-0 157 508). Immediately after coating, the prepared adhesive tape was perforated with circular holes of 0.13 mm² in area in a staggered arrangement pitch distance of 1 mm between each hole to obtain an adhesive tape for processing semiconductor wafers (see FIG. 3). This tape showed a tensile strength of 15 N/20 mm and an elongation of 55% in machine direction and tensile strength of 14 N/20 mm and an elongation of 70% in cross direction.

COMPARATIVE EXAMPLE 1

As the Comparative Example a standard PVC film having a thickness of 70 μm and acrylic adhesive (thickness 10 μm) which is generally used for processing silicone wafers using rotary diamond blade technology was prepared.

The results are summarized in Table I below.

TABLE I

| | | Example 1 | Example 2 | Example 3 | Example 4 | Example 5 | Comparative Example 1 |
|---|---|---|---|---|---|---|---|
| Film | | PP non-woven 200 μm | PP non-woven 200 μm | PE/EVA film with holes of 200 μm | PE/EVA film with holes of 150 μm | PE/EVA film with holes of 200 μm | PVC 70 μm |
| Adhesive | | Acrylic 15 μm | Acrylic 15 μm | Acrylic 15 μm | Acrylic 15 μm | Acrylic(UV-curable) 10 μm | Acrylic 10 μm |
| Cavity ratio | | 30% | 50% | 4% | 40% | 24% | 0% |
| tensile strength | MD | 22 N/20 mm | 18 N/20 mm | 20 N/20 mm | 15 N/20 mm | 15 N/20 mm | 45 N/20 mm |
| | CD | 16 N/20 mm | 15 N/20 mm | 17 N/20 mm | 12 N/20 mm | 14 N/20 mm | 35 N/20 mm |
| Elongation | MD | 55% | 110% | 60% | 50% | 55% | 250% |
| | CD | 70% | 125% | 70% | 60% | 70% | 280% |
| adhesive strength | | 5 N/20 mm | 5 N/20 mm | 5 N/20 mm | 5 N/20 mm | 8 N/20 mm (before)* 0.2 N/20 mm (after)* | 2 N/20 mm |

*curing treatment

A semiconductor wafer having a diameter of 12.7 cm (5 inches) was bonded to each thin adhesive tape of Examples 1 to 5 and the Comparative Example and was then cut into element chips using a laser beam combined with the water microjet, with a diameter of the water jet of 50 μm.

After cutting, each example was tested in view of film damage, cutting surface condition of the chip, chip damage, detachment between the tape and the wafer and contamination.

Dicing Conditions:

Dicing equipment: made by Synova

Dicing speed: 50 mm/s

Laser diameter: 50 μm

Laser wavelength: 1064 nm

Water jet pressure: 40 MPa (400 bar)

Chip size: 3 mm×3 mm

Wafer size: 13.7 cm (5 inch)

The base film itself was not damaged by the laser beam in Examples 1 to 5 in accordance with the present invention when the tapes were directly irradiated. Furthermore, the thin adhesive sheets in accordance with Examples 1 to 5 were not deteriorated by the water jet even at a pressure of 40 MPa (400 bar). The fibers of the non-woven base film (Examples 1 and 2) do not represent an obstacle to the water jet because the fiber diameter (20 μm) is much smaller than the water jet. Moreover, the heat of the molten silicon did not cut the adhesive tapes in accordance with the present invention. Furthermore, all water was drained through the perforations of the base film and the semiconductor wafer was not at all detached from the adhesive tape. Moreover, the backside of the semiconductor wafer was not contaminated with silicon particles after the cutting. As a result, a clean cut of the wafer could be observed from the top side as well as from the backside thereof with no chipping and no silicon particles attached to the cut. During the processing no chip-fly was observed, and a very straight cut could be obtained. In a consecutive step, the processed semiconductor wafer bonded to the adhesive tape was evaluated in terms of its stretchability. The elongation performed homogenous and the processed chips could be properly removed from the adhesive tape.

However, when the adhesive tape according to Comparative Example 1 was used in the dicing process using the laser beam combined with the water microjet, it was observed that the adhesive tape detached itself from around the cut between 0.5 to 1 mm at either side of the cut even at a low pressure of the water jet. This detachment was caused by the fact that the water jet pushed down the wafer even at low pressures. As a consequence, the backside of the element chips were contaminated with molten silicon particles. Furthermore, if a flat support was adhered below the adhesive tape in order to support the wafer and the tape during the dicing process, a detachment was still observed causing contamination and eventually also further damaging of the chip sides (chipping).

The invention claimed is:

1. An adhesive tape for processing semiconductor wafers and/or semiconductor related materials, comprising (i) an adhesive tape and (ii) a semiconductor wafer or a semiconductor material affixed to the adhesive tape, the adhesive tape comprising at least one water-permeable base film and an adhesive applied only on one surface of the at least one water-permeable base film, and the at least one water-permeable base film possesses perforations and has a cavity ratio of 3.0 to 90%.

2. The adhesive tape according to claim 1, wherein the adhesive applied on one surface of the at least one water-permeable base film does not have perforations.

3. The adhesive tape according to claim 1, wherein the semiconductor wafer or semiconductor material of the combination is processed by a laser beam guided by a water stream.

4. The adhesive tape according to claim 1, wherein the at least one water-permeable base film comprises a synthetic resin or a non-woven fabric.

5. The adhesive tape according to claim 1, wherein the perforations range in size from 0.001 to 3.0 mm$^2$.

6. The adhesive tape according to claim 1, wherein the adhesive applied on one surface of the at least one water-permeable base film comprises a rubber-based or acrylic-based adhesive.

7. The adhesive tape according to claim 1, wherein the adhesive applied on one surface of the at least one water-permeable base film is pressure-sensitive, light-sensitive and/or heat-sensitive.

8. The adhesive tape according to claim 1, wherein the adhesive tape has an elongation of more than 10%.

9. The adhesive tape according to claim 1, wherein the adhesive tape has a tensile strength of more than 0.1 N/20 mm.

10. The adhesive tape according to claim 1, wherein the adhesive tape has an adhesive strength of 0.15 to 10 N/20 mm.

11. The adhesive tape according to claim 1, wherein the perforations are artificial perforations.

12. The adhesive tape according to claim 1, wherein the perforations are artificial perforations and has a cavity ratio of 3 to 60%.

13. The adhesive tape according to claim 1, wherein the perforations are artificial perforations and has a cavity ratio of 10 to 55%.

14. The adhesive tape according to claim 1, wherein the at least one water-permeable base film possesses artificial perforations and has a cavity ratio of 20 to 50%.

15. The adhesive tape according to claim 1, wherein the adhesive comprises a rubber-based or acrylic-based adhesive.

16. The adhesive tape according to claim 1, wherein the adhesive is pressure-sensitive, light-sensitive and/or heat-sensitive.

17. An adhesive tape for processing semiconductor wafers and/or semiconductor related materials, comprising (i) an adhesive tape and (ii) a semiconductor wafer or a semiconductor material affixed to the adhesive tape, the adhesive tape comprising at least one water-permeable base film and an adhesive applied on one surface of the at least one water-permeable base film, and the at least one water-permeable base film possesses artificial perforations and has a cavity ratio of 3 to 60%.

18. The adhesive tape according to claim 17, wherein the at least one water-permeable base film possesses artificial perforations and has a cavity ratio of 10 to 55%.

19. The adhesive tape according to claim 17, wherein the at least one water-permeable base film possesses artificial perforations and has a cavity ratio of 20 to 50%.

* * * * *